(12) United States Patent
Yamada et al.

(10) Patent No.: US 6,555,905 B2
(45) Date of Patent: Apr. 29, 2003

(54) HEAT CONDUCTIVE SILICONE COMPOSITION AND SEMICONDUCTOR DEVICE

(75) Inventors: Kunihiro Yamada, Matsuida-machi (JP); Kazuhiro Toba, Matsuida-machi (JP); Takayuki Takahashi, Matsuida-machi (JP); Kenichi Isobe, Matsuida-machi (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/887,266

(22) Filed: Jun. 25, 2001

(65) Prior Publication Data

US 2002/0014692 A1 Feb. 7, 2002

(30) Foreign Application Priority Data

Jun. 23, 2000 (JP) ........................................ 2000-189821

(51) Int. Cl.[7] .............................................. H01L 23/34
(52) U.S. Cl. ...................................... 257/712; 257/791
(58) Field of Search ................................ 257/712, 791; 438/122; 508/172; 524/262, 266

(56) References Cited

U.S. PATENT DOCUMENTS 6,040,362 A   3/2000   Rikako et al.

FOREIGN PATENT DOCUMENTS

| EP | 0496419 | 7/1992 |
|----|---------|--------|
| EP | 0982392 | 3/2000 |
| JP | 61157569 | 7/1986 |
| JP | 8208993 | 8/1996 |

*Primary Examiner*—Tom Thomas
*Assistant Examiner*—Douglas W. Owens
(74) *Attorney, Agent, or Firm*—Millen, White, Zelano & Branigan, P.C.

(57) ABSTRACT

A heat conductive silicone composition comprising (A) an alkenyl group-bearing organopolysiloxane, (B) an organohydrogenpolysiloxane having at least two Si—H groups, (C) a filler consisting of aluminum powder and zinc oxide powder in a weight ratio of from 1/1 to 10/1, (D) an organosilane having a long-chain alkyl groups, (E) platinum or a platinum compound, and (F) a regulator has a high thermal conductivity and maintains flexibility even when exposed to heat for an extended period of time.

20 Claims, 1 Drawing Sheet

HEAT CONDUCTIVE SILICONE COMPOSITION AND SEMICONDUCTOR DEVICE

This invention relates to silicone compositions having an improved heat transfer ability, and semiconductor devices using the same.

BACKGROUND OF THE INVENTION

IC packages such as central processing units (CPU) and other electronic parts mounted on printed circuit boards will deteriorate their performance or even fail on account of temperature rises by the heat generated during operation. In the prior art, heat dissipating sheets or grease having a good heat transfer ability is employed between the IC package and the finned heat sink. The heat dissipating sheets have the advantage of easy mounting. Since the surface of CPU or finned heat sink is microscopically irregular despite apparent flatness, it is difficult in practice to intimately bond the heat dissipating sheet to the adherend surface, often leaving an air gap therebetween. This leads to the disadvantage that the heat dissipating sheet fails to exert the heat dissipating effect as desired. One typical solution proposed thus far is to provide the heat dissipating sheet with a pressure-sensitive adhesive layer for achieving a more intimate bond, which is still insufficient. The heat dissipating grease can intimately follow and contact the surface of CPU and finned heat sink independent of irregularities on the adherend surface, but can foul adjacent parts and gives rise to the problem of oil leakage during long-term service. To overcome these problems, JP-A 61-157569 and 8-208993 propose the use of liquid silicone rubber compositions as potting agent or adhesive. However, these silicone rubber compositions have a short thermal conductivity on account of the reduced content of heat conductive filler. Due to heat release from CPU and moisture in the ambient atmosphere, the silicone rubber compositions in the cured state tend to gradually harden, finally losing flexibility so that they peel off from the substrate or CPU. As a result, the compositions undesirably increase their thermal resistance with the lapse of time.

SUMMARY OF THE INVENTION

An object of the invention is to provide a heat conductive silicone composition which has a high thermal conductivity and maintains flexibility even when exposed to heat over a long period of time. Another object is to provide a semiconductor device using the same.

The invention is directed at a silicone composition of the addition reaction curing type comprising (A) an organopolysiloxane having at least two alkenyl groups in a molecule and (B) an organohydrogenpolysiloxane having at least two silicon atom-bonded hydrogen atoms in a molecule. It has been found that by using a specific amount of an organohydrogenpolysiloxane of the following general formula (1) as component (B), blending a mixture of aluminum powder and zinc oxide powder in a weight ratio of from 1/1 to 10/1 as a filler, and further blending a long chain alkyl group-bearing organosilane of the following general formula (2), there is obtained a heat conductive silicone composition which has a fully high thermal conductivity by virtue of a possible increase in the amount of filler blended and does not lose flexibility even when exposed to heat for a long period of time. Efficient heat dissipation is achieved by interposing a cured film of the heat conductive silicone composition between a semiconductor chip and a heat dissipator. More specifically, in a heat dissipating means for IC package comprising an IC package mounted on a printed circuit board and a heat dissipator disposed on the surface of the IC package, the heat conductive silicone composition is cast between the IC package and the heat dissipator and heat cured thereat to form a cured film having a thickness of 25 to 100 μm.

Accordingly, the invention provides a heat conductive silicone composition comprising
(A) 100 parts by weight of an organopolysiloxane having at least two alkenyl groups in a molecule,
(B) an organohydrogenpolysiloxane having at least two silicon atom-bonded hydrogen atoms in a molecule, represented by the following general formula (1):

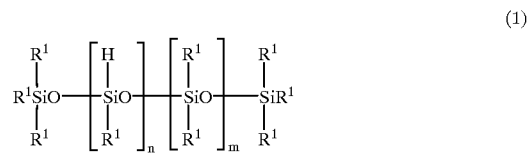

(1)

wherein $R^1$ is an alkyl group of 1 to 6 carbon atoms, and n and m are integers satisfying $0.01 \leq n/(n+m) \leq 0.3$, in such an amount that the ratio of the number of Si—H groups in component (B) to the number of alkenyl groups in component (A) may range from 0.8/1 to 1.5/1,
(C) 800 to 1,200 parts by weight of a filler consisting of aluminum powder and zinc oxide powder in a weight ratio of from 1/1 to 10/1,
(D) 0.01 to 10 parts by weight of an organosilane of the following general formula (2):

(2)

wherein $R^2$ is an alkyl group of 9 to 15 carbon atoms, $R^3$ is a monovalent hydrocarbon group of 1 to 8 carbon atoms, $R^4$ is an alkyl group of 1 to 6 carbon atoms, "a" is an integer of 1 to 3, "b" is an integer of 0 to 2, and a+b is an integer of 1 to 3,
(E) a catalyst selected from the group consisting of platinum and platinum compounds in such an amount as to give 0.1 to 500 parts by weight of platinum atoms per million parts by weight of component (A), and
(F) 0.01 to 1 part by weight of a regulator.

Also contemplated herein is a semiconductor device comprising a semiconductor chip and a heat dissipator wherein a cured film of the heat conductive silicone composition having a thickness of 25 to 100 μm is interposed between the chip and the heat dissipator.

In a further embodiment of the invention, there is provided a semiconductor device comprising an IC package mounted on a printed circuit board and a heat dissipator disposed on the surface of the IC package wherein a cured film of the heat conductive silicone composition having a thickness of 25 to 100 μm is interposed between the IC package and the heat dissipator.

DESCRIPTION OF THE PREFERRED EMBODIMENT

Figure 1:
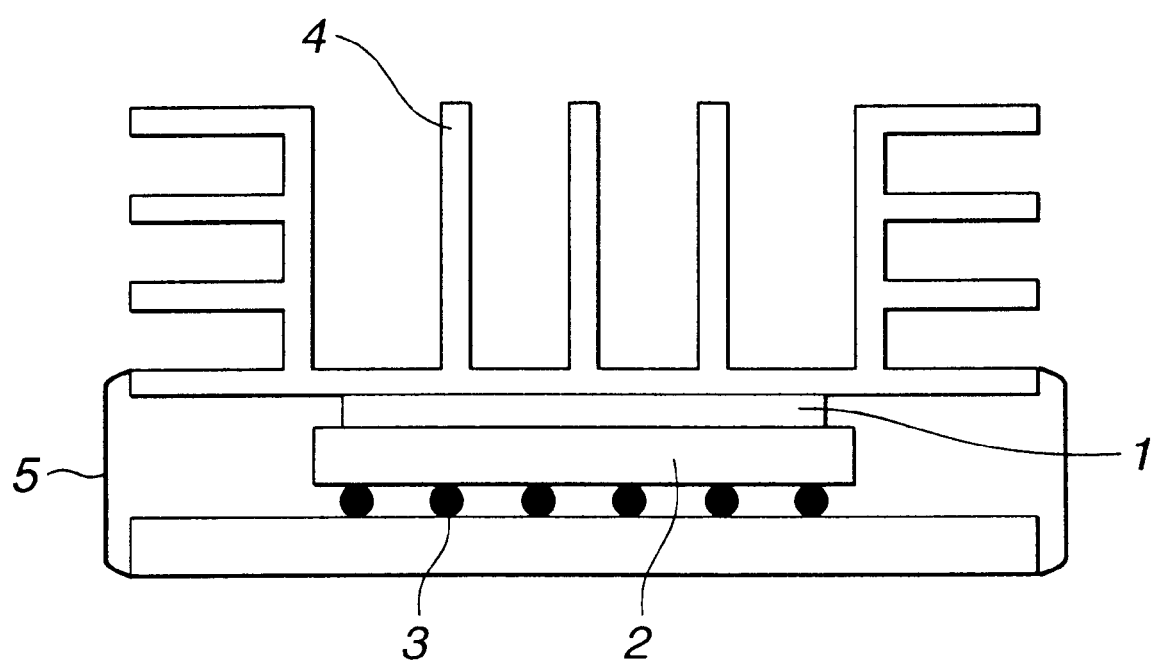
FIG. 1 is a schematic cross-sectional view of a semiconductor device according to one embodiment of the invention.

Component (A) of the heat conductive silicone composition according to the invention is an organopolysiloxane having at least two alkenyl groups, each directly attached to a silicon atom, in a molecule. The organopolysiloxane may be either straight or branched. A mixture of two or more organopolysiloxanes having different viscosities is acceptable. The organopolysiloxane used herein is preferably of the following average compositional formula (3).

$$R^5_c SiO_{(4-c)/2} \tag{3}$$

Herein $R^5$, each independently, is a substituted or unsubstituted monovalent hydrocarbon group of 1 to 18 carbon atoms, preferably 1 to 3 carbon atoms, and c is a positive number in the range of 1.5 to 2.8, preferably 1.8 to 2.5, and more preferably 1.95 to 2.05.

Examples of the substituted or unsubstituted monovalent hydrocarbon group attached to a silicon atom represented by $R^5$ include alkyl groups such as methyl, ethyl, propyl, isopropyl, butyl, isobutyl, tert-butyl, pentyl, neopentyl, hexyl, cyclohexyl, octyl, nonyl, decyl and dodecyl; aryl groups such as phenyl, tolyl, xylyl and naphthyl; aralkyl groups such as benzyl, phenylethyl and 2-phenylpropyl alkenyl groups such as vinyl, allyl, propenyl, isopropenyl, 1-butenyl, 1-hexenyl, cyclohexenyl and octenyl; and substituted ones of the foregoing groups in which some or all of the hydrogen atoms are substituted with halogen atoms (e.g., fluorine, bromine and chlorine), cyano groups or the like, such as chloromethyl, chloropropyl, bromoethyl, 3,3,3-trifluoropropyl and cyanoethyl.

At least two of the $R^5$ groups should be alkenyl groups, preferably of 2 to 8 carbon atoms, especially 2 to 6 carbon atoms. It is preferred that the content of alkenyl groups be 0.001 to 20 mol %, especially 0.01 to 10 mol %, of the entire organic groups attached to silicon atoms, that is, the entire substituted or unsubstituted monovalent hydrocarbon groups represented by $R^5$ in formula (3). The alkenyl groups may be attached to the silicon atoms at the ends of the molecular chain or silicon atoms intermediate the molecular chain or both. From the standpoints of composition curing rate and cured physical properties, the organopolysiloxane used herein should preferably have at least an alkenyl group attached to the silicon atom at the end of the molecular chain.

The organopolysiloxane (A) should preferably have a viscosity at 25° C. in the range of 10 to 100,000 mm$^{2}$/s, especially 100 to 50,000 mm$^{2}$/s. With a viscosity of less than 10 mm2/s, the composition may become less stable during storage. With a viscosity of more than 100,000 mm$^{2}$/s, the composition may become less castable.

Component (B) is an organohydrogenpolysiloxane having at least two, preferably at least three, silicon atom-bonded hydrogen atoms (i.e., Si—H groups) in a molecule. Specifically, it is a linear organohydrogenpolysiloxane having Si—H groups on side chains, represented by the following general formula (1):

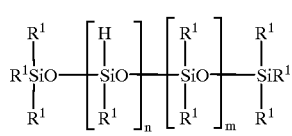

(1)

wherein $R^1$ is an alkyl group of 1 to 6 carbon atoms, and n and m are integers satisfying $0.01 \leq n/(n+m) \leq 0.3$.

More particularly, $R^1$ is an alkyl group selected from among methyl, ethyl, propyl, butyl, hexyl and analogues. Of these, methyl is preferred because of ease of synthesis and cost. If n/(n+m) in formula (1) is less than 0.01, the composition is prevented from crosslinking into a network structure. If n/(n+m) is more than 0.3, more Si—H groups are left unreacted after initial cure, so that moisture or other factors can drive crosslinking reaction to an excessive extent with the lapse of time, resulting in the composition losing flexibility. For this reason, n/(n+m) in formula (1) should be in the range of 0.01 to 0.3, preferably 0.05 to 0.2. The sum of n+m is preferably about 5 to 500, especially about 10 to 300, though not limited thereto.

The amount of component (B) blended is such that the ratio of the number of Si—H groups in component (B) to the number of alkenyl groups in component (A) may range from 0.8/1 to 1.5/1, preferably from 0.9/1 to 1.3/1. If (number of Si—H groups)/(number of alkenyl groups) is less than 0.8, the composition fails to form a satisfactory network structure or reach the necessary cured hardness. If (number of Si—H groups)/(number of alkenyl groups) is more than 1.5, unreacted Si—H groups can undergo excessive crosslinking reaction with moisture so that the composition loses flexibility. Usually, 0.1 to 50 parts, especially 0.5 to 30 parts by weight of component (B) is blended per 100 parts by weight of component (A).

Component (C) is a filler for imparting thermal conductivity to the inventive composition. The filler used herein is a mixture of aluminum powder and zinc oxide powder. If the aluminum powder used herein has a mean particle size of less than 0.1 μm, the resulting composition may become too viscous and less castable. If the aluminum powder used herein has a mean particle size of more than 50 μm, the composition may become non-uniform. For this reason, the aluminum powder used herein should preferably have a mean particle size of 0.1 to 50 μm, more preferably 1 to 20 μm. If the zinc oxide powder used herein has a mean particle size of less than 0.1 μm, the resulting composition may become too viscous and less castable. If the zinc oxide powder used herein has a mean particle size of more than 5 μm, the composition may become non-uniform. For this reason, the zinc oxide powder used herein should preferably have a mean particle size of 0.1 to 5 μm, more preferably 1 to 4 μm. The aluminum and zinc oxide powder particles may be of spherical or irregular shape.

The thermal conductivity of these minerals is discussed below. The aluminum powder and the zinc oxide powder have a thermal conductivity of about 237 μ/mK and about 20 μ/mK, respectively, indicating that aluminum powder alone is more advantageous in achieving a higher thermal conductivity. However, aluminum powder used alone gives a composition which is unstable and prone to oil separation. It has been found that mixing aluminum powder with zinc oxide powder is effective for preventing oil separation. If the weight ratio of aluminum powder/zinc oxide powder is less than 1/1, the resulting composition becomes less heat conductive. If the same ratio is more than 10/1, noticeable oil separation occurs with time. Therefore, the weight ratio of aluminum powder/zinc oxide powder is from 1 to 10, preferably from 2 to 8.

The amount of the aluminum powder/zinc oxide powder mixture blended is 800 to 1,200 parts, preferably 850 to 1,150 parts by weight per 100 parts by weight of component (A). On this basis, the composition containing less than 800 parts of the powder mixture becomes less heat conductive whereas the composition containing more than 1,200 parts of the powder mixture becomes less castable.

Component (D) is an organosilane of the following general formula (2):

$$R^2_a R^3_b Si(OR^4)_{4-a-b} \tag{2}$$

wherein $R^2$ is an alkyl group of 9 to 15 carbon atoms, $R^3$ is a monovalent hydrocarbon group of 1 to 8 carbon atoms, $R^4$ is an alkyl group of 1 to 6 carbon atoms, "a" is an integer of 1 to 3, "b" is an integer of 0 to 2, and the sum of a+b is an integer of 1 to 3.

The organosilane serves as a wetter. Since component (A) has a poor wettability to the filler, a large amount of the filler cannot be loaded unless the wetter is added upon mixing. It has been found that the addition of the organosilane of formula (2) permits the composition to be loaded with a significantly increased amount of the filler.

Referring to formula (2), $R^2$ is an alkyl group of 9 to 15 carbon atoms, for example, nonyl, decyl, dodecyl and tetradecyl. With less than 9 carbon atoms, the wettability to the filler is insufficient. With more than 15 carbon atoms, the organosilane becomes inconvenient to handle because of solidification at room temperature and the resulting composition has poor low-temperature properties. The letter a is 1, 2 or 3, preferably equal to 1. $R^3$ is selected from saturated or unsaturated monovalent hydrocarbon groups of 1 to 8 carbon atoms, for example, alkyl groups such as methyl, ethyl, propyl, hexyl and octyl, cycloalkyl groups such as cyclopentyl and cyclohexyl, alkenyl groups such as vinyl and allyl, aryl groups such as phenyl and tolyl, aralkyl groups such as 2-phenylethyl and 2-methyl-2-phenylethyl, and halogenated hydrocarbon groups such as 3,3,3-trifluoropropyl, 2-(perfluorobutyl)ethyl, 2 -(perfluorooctyl) ethyl and p-chlorophenyl. Methyl and ethyl are preferred among others. $R^4$ is an alkyl group of 1 to 6 carbon atoms, for example, methyl, ethyl, propyl, butyl, pentyl and hexyl, with methyl and ethyl being preferred.

Illustrative, non-limiting, examples of the organosilane of the formula (2) include

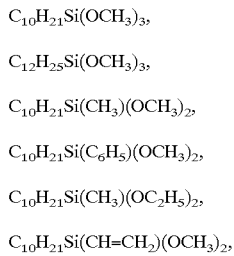

and

An appropriate amount of the organosilane blended is 0.01 to 10 parts, preferably 0.1 to 5 parts by weight per 100 parts by weight of component (A). Less than 0.01 part of the organosilane exerts less wetting effects whereas more than 10 parts of the organosilane gives little further effects and is uneconomical.

Component (E) is a catalyst selected from among platinum and platinum compounds, which serves to promote addition reaction between alkenyl groups in component (A) and Si—H groups in component (B). Exemplary catalysts are elemental platinum, chloroplatinic acid, platinum-olefin complexes, platinum-alcohol complexes, and platinum coordinate compounds. An appropriate amount of the catalyst is such as to give 0.1 to 500 parts by weight of platinum atoms per million parts by weight of component (A). Less than 0.1 ppm of platinum fails to exert catalytic effects, whereas no further increase in curing rate is expectable with more than 500 ppm of platinum.

Component (F) is a regulator for restraining the progress of hydrosilylation reaction at room temperature for thereby extending the shelf life and pot life. The reaction regulator may be selected from well-known compounds, for example, acetylene compounds, nitrogen compounds, organic phosphorus compounds, oxime compounds and organic chlorine compounds. An appropriate amount of the regulator (F) is 0.01 to 1 part by weight per 100 parts by weight of component (A). Less than 0.01 part of the regulator is too small to give a satisfactory shelf life or pot life whereas more than 1 part of the regulator detracts from curability.

In addition to the above-mentioned components (A) to (F), the heat conductive silicone composition of the invention may have added thereto additives if desired. For example, there may be added adhesion aids for chemically bond and secure the IC package (such as CPU) to the heat dissipator (such as heat sink) and antioxidants for preventing deterioration.

The heat conductive silicone composition of the invention is obtained by mixing components (A) to (F) and optional components. The composition in the one-part addition form allows for long-term, low-temperature storage.

In a typical advantageous application, the heat conductive silicone composition of the invention is interposed between a semiconductor chip and a heat dissipator so the composition serves as a heat transfer member for conducting the heat produced by the semiconductor chip to the heat dissipator. Where the composition is used as a heat transfer member or in another application, it is cured under appropriate conditions, for example, by heating at a temperature of about 60 to 200° C. for about 5 to 120 minutes.

According to the invention, a semiconductor device is provided wherein a cured film of the heat conductive silicone composition is interposed between a semiconductor chip and a heat dissipator. In a specific embodiment of the invention, there is provided a heat dissipating apparatus for IC package comprising an IC package mounted on a printed circuit board and a heat dissipator disposed on the surface of the IC package wherein a cured film of the heat conductive silicone composition is interposed between the IC package and the heat dissipator.

In fabricating the semiconductor devices according to the invention, the heat conductive silicone composition is contained in a commercially available syringe and dispensed therefrom onto the surface of IC packages such as CPU. For such application, the composition should preferably have a viscosity in the range of 100 to 1,000 Pa·s, more preferably 200 to 400 Pa·s at 25° C. A composition with a viscosity of less than 100 Pa·s may drip upon dispensing whereas a viscosity of higher than 1,000 Pa·s may impede efficient dispensing.

By applying the heat conductive silicone composition between a printed circuit board and a heat dissipator and fastening the board and the heat dissipator together by means of a clamp or the like, the composition is secured and compressed between the IC package and the heat dissipator. The composition interposed between the IC package and the heat dissipator should have a thickness in the range of 25 to 100 μm, preferably 25 to 50 μm. A thickness of less than 25 μm allows a slight shift of compression to create a gap between the IC package and the heat dissipator whereas a thickness of more than 100 μm provides a substantial thermal resistance which may exacerbate the heat dissipating effects.

After dispensing, the composition cures with the heat produced by the IC package. Once cured, the composition has a sufficient tack to prevent displacement and a long-lasting flexibility to prevent its peeling from the substrates. Alternatively, the composition may be positively heat cured after dispensing.

In the above-described embodiment, the heat conductive silicone composition to be interposed between the IC package and the heat dissipator is pasty and castable, so that even when the IC package and the heat dissipator have irregularities on their surface, the gaps therebetween can be evenly filled with the silicone composition simply by pressing the heat dissipator onto the silicone composition on the IC package. By virtue of the heat produced by the IC package, the silicone composition is cured and bonded in situ. The silicone composition does not lose flexibility with time or peel from the substrates. Therefore, the silicone composition ensures to exert the desired heat dissipating effects, improving the reliability of the overall electronic part.

EXAMPLE

Examples of the invention are given below by way of illustration and not by way of limitation.

Examples & Comparative Examples

The following components were furnished.
Component (A)
A-1: dimethylpolysiloxane blocked with a dimethylvinyl-silyl group at either end and having a viscosity of 600 mm$^2$/s at 25° C.
A-2: dimethylpolysiloxane blocked with a dimethylvinyl-silyl group at either end and having a viscosity of 30,000 mm$^2$/s at 25° C.
Component (B)
Organohydrogenpolysiloxanes B-1 to B-4 were used.

B-1
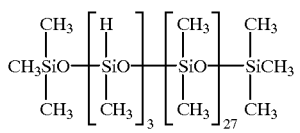

B-2
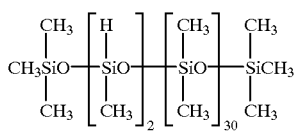

B-3 (comparison)
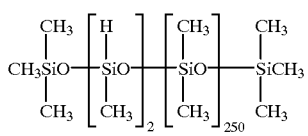

B-4 (comparison)
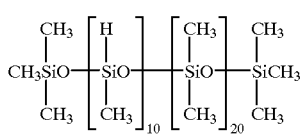

Component (C)
Powder mixtures C-1 to C-6 were obtained by mixing aluminum powder and zinc oxide powder in a weight ratio as shown in Table 1 at room temperature for 15 minutes in a 5-liter planetary mixer (Inoue Mfg. K.K.).
Aluminum powder with a mean particle size of 4.9 μm
Aluminum powder with a mean particle size of 15.0 μm
Zinc oxide powder with a mean particle size of 1.0 μm

TABLE 1

| Component (C) | 4.9 μm Al powder (g) | 15.0 μm Al powder (g) | 1.0 μm ZnO powder (g) | Mixing ratio (Al powder/ ZnO powder) |
|---|---|---|---|---|
| C-1 | 2,000 | 0 | 1,000 | 2 |
| C-2 | 2,500 | 0 | 500 | 5 |
| C-3 | 0 | 2,500 | 500 | 5 |
| C-4 | 2,667 | 0 | 333 | 8 |
| C-5 (comparison) | 143 | 0 | 2,857 | 0.5 |
| C-6 (Comparison) | 2,750 | 0 | 250 | 11 |

Component (D)
Organosilanes D-1 to D-7 were used.
D-1: $C_{10}H_{21}Si(OCH_3)_3$
D-2: $C_{12}H_{25}Si(OCH_3)_3$
D-3: $C_{14}H_{29}Si(OCH_3)_3$ D-4: $C_{10}H_{21}\underset{\underset{CH_3}{|}}{Si}(OCH_3)_2$ D-5: $CH_3Si(OCH_3)_3$ (comparison)
D-6: $C_6H_{13}Si(OCH_3)_3$ (comparison)
D-7: $C_8H_{17}Si(OCH_3)_3$ (comparison)
Component (E)
E-1: A-1 solution of platinum-divinyltetramethyl-disiloxane complex, containing 1% of platinum atoms
Component (F)
F-1: 1-ethynyl-1-cyclohexanol
Heat conductive silicone compositions of Examples 1–7 and Comparative Examples 1–11 were prepared by mixing components (A) to (F) as follows. In a 5-liter planetary mixer (Inoue Mfg. K.K.), component (A) was placed, components (C) and (D) were added thereto in the amounts shown in Tables 2 and 3, and the contents were mixed for one hour at 70° C. The mixture was cooled down to room temperature, to which components (B), (E) and (F) were added thereto in the amounts shown in Tables 2 and 3, and the contents were mixed until uniform.
The compositions thus obtained were examined by the following tests. The results are shown in Tables 2 and 3.
(1) Viscosity: measured by a rotary viscometer at 25° C.
(2) Thermal conductivity
Each composition was cast into a mold of 6 mm high and heated at 120° C. for one hour, forming a rubber sheet of 6 mm thick, which was cooled down to 25° C. Four rubber sheets were stacked to form a block having a total thickness of 24 mm. The thermal conductivity of this block was measured by a quick thermal conductivity meter Model QTM-500 (Kyoto Electronic Industry K.K.).
(3) Shelf stability
After each composition was held at −5° C. for one month, its outer appearance was visually inspected.
O: no separation
X: noticeable oil bleeding
(4) Hardness
The composition was evaluated for flexibility with time by measuring the hardness thereof according to JIS K6253 (JIS-A hardness). Each composition was cast into a mold of 6 mm high and heated at 120° C. for one hour, forming a rubber sheet of 6 mm thick, which was cooled down to 25° C. The initial hardness of the rubber sheet was measured. Thereafter, the rubber sheet was held for 100 hours in an atmosphere having a temperature of 130° C., a humidity of 100% and a pressure of 2 atm. It was cooled down to 25° C. and measured for hardness again (aged hardness).

TABLE 2

| Component | Example | | | | | | |
|---|---|---|---|---|---|---|---|
| (pbw) | 1 | 2 | 3 | 4 | 5 | 6 | 7 |
| A-1 | 75 | 75 | 75 | 100 | 75 | 75 | 75 |
| A-2 | 25 | 25 | 25 | | 25 | 25 | 25 |
| B-1 | 9.8 | | | | 11.4 | 11.4 | 11.4 |
| B-2 | | 13.7 | 15.2 | 18.2 | | | |
| B-3 | | | | | | | |
| B-4 | | | | | | | |
| Si—H/Si—Vi (number ratio) | 1.0 | 0.9 | 1.0 | 1.2 | 1.2 | 1.3 | 1.3 |

TABLE 2-continued

| Component | Example | | | | | | |
|---|---|---|---|---|---|---|---|
| (pbw) | 1 | 2 | 3 | 4 | 5 | 6 | 7 |
| C-1 | 900 | | | | | | |
| C-2 | | 850 | | | 1000 | 1000 | 1000 |
| C-3 | | | 850 | | | | |
| C-4 | | | | 1150 | | | |
| C-5 | | | | | | | |
| C-6 | | | | | | | |
| D-1 | 0.5 | 0.3 | 0.3 | 1.0 | | | |
| D-2 | | | | | 1.0 | | |
| D-3 | | | | | | 1.0 | |
| D-4 | | | | | | | 1.0 |
| D-5 | | | | | | | |
| D-6 | | | | | | | |
| D-7 | | | | | | | |
| E-1 | 0.15 | 0.15 | 0.15 | 0.15 | 0.15 | 0.15 | 0.15 |
| F-1 | 0.15 | 0.15 | 0.15 | 0.15 | 0.15 | 0.15 | 0.15 |
| Viscosity (Pa · s) | 278 | 250 | 248 | 320 | 303 | 312 | 317 |
| Thermal conductivity (W/mK) | 3.6 | 3.5 | 3.5 | 4.0 | 3.9 | 3.8 | 3.8 |
| Initial hardness | 56 | 60 | 59 | 66 | 58 | 63 | 65 |
| Aged hardness* | 58 | 61 | 59 | 67 | 58 | 65 | 67 |
| Shelf stability | ○ | ○ | ○ | ○ | ○ | ○ | ○ |

*130° C./100% humidity/2 atm. /100 hr.

Next, the heat conductive silicone compositions of the foregoing Examples were applied to semiconductor devices. FIG. 1 is an elevational cross section of a semiconductor device having an IC package according to one embodiment of the invention.

As shown in FIG. 1, the semiconductor device includes a CPU 2 mounted on a printed circuit board 3, a heat sink 4 disposed on the CPU 2, and a cured film 1 of the heat conductive silicone composition interposed between the CPU 2 and the heat sink 4. The heat sink 4 is formed of aluminum and provided with fins for increasing the surface area for enhancing heat dissipating effects. The printed circuit board 3 and the heat sink 4 are fastened and secured by a clamp 5, whereby the film 1 is compressed therebetween.

In this semiconductor device, 0.2 g of the heat conductive silicone composition of each Example was applied onto a surface area of 2 cm×2 cm and interposed between the CPU 2 and the heat sink 4. The cured film of the silicon composition was 45 μm thick.

The IC package heat dissipating structure of the elk above-described arrangement was applied to CPU's having a heating temperature of the order of 150° C. as commonly used in host computers and personal computers. Stable heat dissipation and diffusion took place, preventing the CPU's from performance deterioration or failure by heat accumulation.

There has been described a heat conductive silicone composition which has a high thermal conductivity and does not lose flexibility even when exposed to heat for a long time.

Japanese Patent Application No. 2000-189821 is incorporated herein by reference.

TABLE 3

| Component | Comparative Example | | | | | | | | | | |
|---|---|---|---|---|---|---|---|---|---|---|---|
| (pbw) | 1 | 2 | 3 | 4 | 5 | 6 | 7 | 8 | 9 | 10 | 11 |
| A-1 | 75 | 75 | 75 | 75 | 75 | 75 | 75 | 75 | 75 | 75 | 75 |
| A-2 | 25 | 25 | 25 | 25 | 25 | 25 | 25 | 25 | 25 | 25 | 25 |
| B-1 | 9.8 | 9.8 | 9.8 | 9.8 | 8.5 | 9.8 | 12.3 | 6.6 | 15.2 | | |
| B-2 | | | | | | | | | | | |
| B-3 | | | | | | | | | | 114 | |
| B-4 | | | | | | | | | | | 2.7 |
| Si—H/Si—Vi (number ratio) | 1.0 | 1.0 | 1.0 | 1.0 | 0.9 | 1.0 | 1.3 | 0.7 | 1.6 | 1.0 | 1.0 |
| C-1 | 700 | 1300 | | | 900 | 900 | 900 | | | | |
| C-2 | | | | | | | | 850 | | | |
| C-3 | | | | | | | | | 850 | | |
| C-4 | | | | | | | | | | 1000 | 1000 |
| C-5 | | | | 900 | | | | | | | |
| C-6 | | | | | 900 | | | | | | |
| D-1 | 0.5 | 0.5 | | | | | | 0.5 | 0.5 | | |
| D-2 | | | 0.5 | 0.5 | | | | | | 0.5 | 0.5 |
| D-3 | | | | | | | | | | | |
| D-4 | | | | | | | | | | | |
| D-5 | | | | | 0.5 | | | | | | |
| D-6 | | | | | | 0.5 | | | | | |
| D-7 | | | | | | | 0.5 | | | | |
| E-1 | 0.15 | 0.15 | 0.15 | 0.15 | 0.15 | 0.15 | 0.15 | 0.15 | 0.15 | 0.15 | 0.15 |
| F-1 | 0.15 | 0.15 | 0.15 | 0.15 | 0.15 | 0.15 | 0.15 | 0.15 | 0.15 | 0.15 | 0.15 |
| Viscosity(Pa · s) | 190 | ** | 258 | >1000 | ** | ** | >1000 | 195 | 180 | 120 | 380 |
| Thermal conductivity (W/mK) | 2.2 | — | 1.9 | 3.5 | — | — | 3.5 | — | 3.4 | — | 3.5 |
| Initial hardness | 55 | — | 58 | 68 | — | — | 68 | not cured | 65 | not cured | 70 |
| Aged hardness* | 56 | — | 60 | 75 | — | — | 89 | — | 88 | — | 90 |
| Shelf stability | ○ | ○ | ○ | x | — | — | ○ | ○ | ○ | ○ | ○ |

*130° C./100% humidity/2 atm./100 hr.
**not pasty

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A heat conductive silicone composition comprising
   (A) 100 parts by weight of one or more organopolysiloxanes having at least two alkenyl groups in a molecule,
   (B) an organohydrogenpolysiloxane having at least two silicon atom-bonded hydrogen atoms in a molecule, represented by the following general formula (1):

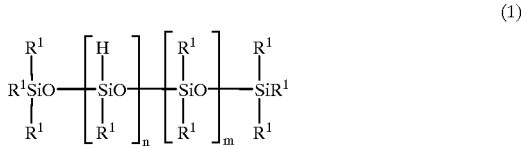

wherein $R^1$ is an alkyl group of 1 to 6 carbon atoms, and n and m are integers satisfying $0.01 \leq n/(n+m) \leq 0.3$, in an amount that the ratio of the number of Si-H groups in component (B) to the number of alkenyl groups in component (A) range from 0.8/1 to 1.5/1,
   (C) 800 to 1,200 parts by weight of a filler consisting of aluminum powder and zinc oxide powder in a weight ratio of from 1/1 to 10/1,
   (D) 0.01 to 10 parts by weight of an organosilane of the following general formula (2):

$$R^2_a R^3_b Si(OR^4)_{4-a-b} \quad (2)$$

wherein R is an alkyl group of 9 to 15 carbon atoms, R is a monovalent hydrocarbon group of 1 to 8 carbon atoms, R is an alkyl group of 1 to 6 carbon atoms, "a" is an integer of 1 to 3, "b" is an integer of 0 to 2, and a+b is an integer of 1 to 3,
   (E) a catalyst selected from the group consisting of platinum and platinum compounds in such an amount as to give 0.1 to 500 parts by weight of platinum atoms per million parts by weight of component (A), and
   (F) 0.01 to 1 part by weight of a regulator.

2. The composition of claim 1 wherein component (A) has a viscosity of 10 to 100,000 mm²/s at 25° C.

3. The composition of claim 1 wherein the filler (C) is a mixture of aluminum powder having a mean particle size of 0.1 to 50 μm and zinc oxide powder having a mean particle size of 0.1 to 5 μm.

4. The composition of claim 1 wherein the regulator (F) is selected from the group consisting of an acetylene compound, nitrogen compound, organic phosphorus compound, oxime compound, and organic chlorine compound.

5. The composition of claim 1 having a viscosity of 100 to 1,000 Pa·s at 25° C.

6. A semiconductor device comprising a semiconductor chip and a heat dissipator, a cured film of the heat conductive silicone composition of claim 1 having a thickness of 25 to 100 μm being interposed between the chip and the heat dissipator.

7. A semiconductor device comprising an IC package mounted on a printed circuit board and a heat dissipator disposed on the surface of the IC package, a cured film of the heat conductive silicone composition of claim 1 having a thickness of 25 to 100 μm being interposed between the IC package and the heat dissipator.

8. The composition of claim 1, wherein component (A) is of average compositional formula (3)

$$R^5_c SiO_{(4-c)/2} \quad (3)$$

wherein $R^5$, each independently, is a substituted or unsubstituted monovalent hydrocarbon group of 1 to 18 carbon atoms, and c is a positive number in the range of 1.5 to 2.8.

9. The composition of claim 8, wherein $R^5$, each independently, is a group of 1 to 3 carbon atoms, and c is 1.8 to 2.5.

10. The composition of claim 1, wherein the at least two alkenyl groups in the one or more organopolysiloxanes, each independently, contain 2 to 8 carbon atoms.

11. The composition of claim 8, wherein 0.001 to 20 mol % of $R^5$ is alkenyl.

12. The composition of claim 1, wherein the sum integers n and m is 5 to 500 and they satisfy $0.05 \leq n(n+m) \leq 0.2$.

13. The composition of claim 1, wherein the ratio of the number of Si—H groups in component (B) to the number of alkenyl groups in component (A) range from 0.9/1 to 1.3/1.

14. The composition of claim 1, wherein the aluminum powder has a mean particle size of 0.1 to 20 microns and the zinc oxide powder has a mean particle size of 0.1 to 4 microns.

15. The composition of claim 1, wherein a is 1.

16. The composition of claim 1, wherein the organosilane of formula (2) is $C_{10}H_{21}Si(OCH_3)_3$, $C_{12}H_{25}Si(OCH_3)_3$, $C_{10}H_{21}Si(CH_3)(OCH_3)_2$, $C_{10}H_{21}Si(C_6H_5)(OCH_3)_2$, $C_{10}H_{21}Si(CH_3)(OC_2H_5)_2$, $C_{10}H_{21}Si(CH=CH_2)(OCH_3)_2$, or $C_{10}H_{21}Si(CH_2CH_2CF_3)(OCH_3)_2$.

17. The composition of claim 1, wherein the composition contains 0.1 to 5 parts by weight of the organosilane.

18. The composition of claim 1, wherein component (A) has a viscosity of 100 to 50,000 mm²/s at 25° C.

19. The composition of claim 1 having a viscosity of 200 to 400 Pas at 25° C.

20. The composition of claim 1, wherein the sum integers n and m is 10 to 300.

* * * * *